United States Patent
Yao et al.

(10) Patent No.: US 10,516,210 B2
(45) Date of Patent: Dec. 24, 2019

(54) PHASE CONTROLLER AND PHASE CONTROLLING METHOD FOR ANTENNA ARRAY, AND COMMUNICATION APPARATUS USING THE SAME

(71) Applicant: NATIONAL CHUNG SHAN INSTITUTE OF SCIENCE AND TECHNOLOGY, Taoyuan (TW)

(72) Inventors: Chia-Yu Yao, Taipei (TW); Shao Chen, New Taipei (TW); Chien-Te Yu, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 250 days.

(21) Appl. No.: 15/848,186

(22) Filed: Dec. 20, 2017

(65) Prior Publication Data

US 2019/0190148 A1 Jun. 20, 2019

(51) Int. Cl.
| | |
|---|---|
| *H01Q 3/40* | (2006.01) |
| *H01Q 3/26* | (2006.01) |
| *H03L 7/22* | (2006.01) |
| *H03L 7/18* | (2006.01) |
| *H01Q 3/36* | (2006.01) |
| *H01Q 21/00* | (2006.01) |

(52) U.S. Cl.
CPC .............. *H01Q 3/40* (2013.01); *H01Q 3/2682* (2013.01); *H01Q 3/2694* (2013.01); *H01Q 3/36* (2013.01); *H03L 7/1806* (2013.01); *H03L 7/22* (2013.01); *H01Q 21/00* (2013.01)

(58) Field of Classification Search
CPC ...... H01Q 3/40; H01Q 3/2682; H01Q 3/2694; H01Q 21/00; H03L 7/1806; H03L 7/22
See application file for complete search history.

(56) References Cited

U.S. PATENT DOCUMENTS

| | | | |
|---|---|---|---|
| 7,999,624 B2* | 8/2011 | Wan .................. | H03L 7/23 331/1 A |
| 2007/0129040 A1* | 6/2007 | Adlerstein .............. | G01S 7/032 455/260 |
| 2008/0297414 A1* | 12/2008 | Krishnaswamy ........ | H01Q 3/28 342/368 |
| 2010/0271140 A1* | 10/2010 | Raghunathan .......... | H03L 7/099 331/34 |

* cited by examiner

*Primary Examiner* — Peter M Bythrow
*Assistant Examiner* — Michael W Justice
(74) *Attorney, Agent, or Firm* — Schmeiser, Olsen & Watts, LLP

(57) ABSTRACT

A phase controller for an antenna array includes a determination circuit, determining a direction index of the antenna array, and calculating a phase index according to the direction index according to a congruence modulo equation; a switching box, selecting L first frequency signals with L different first phases among K first frequency signals with K different first phases according to the phase index, wherein L and K are integer larger than 1, and L is not larger than K; and a frequency synthesizing module, comprising L phase-coherent PLL frequency synthesizers for receiving the L first frequency signals with the L different first phases to generate L second frequency signals with L different second phases to L antennae of the antenna array, wherein a second frequency of the second frequency signals is larger than a first frequency of the first frequency signals.

13 Claims, 10 Drawing Sheets

PHASE CONTROLLER AND PHASE CONTROLLING METHOD FOR ANTENNA ARRAY, AND COMMUNICATION APPARATUS USING THE SAME

FIELD OF THE INVENTION

The present disclosure relates to a communication apparatus having a phase controller or executing a phase controlling method for an antenna array with a plurality of antennae, and in particular to a communication apparatus having a phase controller or executing a phase controlling method for an antenna array by using multiple phase-coherent phase locked loop (PLL) frequency synthesizers based upon a congruence modulo equation.

BACKGROUND OF THE INVENTION

An antenna array with a plurality of antennae is widely used in a communication apparatus, such as a transceiver, a transmitter or a receiver, and the phase of the antenna array can be controlled to have a specific main direction for radiating signals (i.e. the radiation field pattern can be controlled). The conventional controlling manner for the antenna array can be implemented by a plurality of phase shifters or a plurality of PLLs, wherein each neighbor two of the PLLs are coupled to each other.

Referring to FIG. 1A, FIG. 1A is a schematic diagram of a conventional phase controller used in a communication apparatus. In FIG. 1A, the communication apparatus 1 comprises a plurality of phase shifter PS_1 through PS_n and a plurality of antennae ANT_1 through ANT_n, wherein n is an integer larger than 1. The phase shifters PS_1 through PS_n form a conventional phase controller, and the antennae ANT_1 through ANT_n form an antenna array, wherein each neighbor two of the antennae ANT_1 through ANT_n have a separated distance d.

Each of the phase shifters PS_1 through PS_n receives a first transmitted signal and shifts a phase of the transmitted signal, so as to generate a plurality of transmitted signals with different phases $\phi_0$ through $\phi_n$ to the corresponding one of the antennae ANT_1 through ANT_n. The phases $\phi_0$ through $\phi_n$ can determine the angle $\theta$ (in respective to a vertical axis y), or a main radiating direction MD of the antennae array, and the distance d between wave fronts of each neighbor two of the antennae ANT_1 through ANT_n is related to the angle $\theta$ of the antennae array. Therefore, by controlling the phases $\phi_0$ through $\phi_n$, the radiation field pattern of the antenna array can be determined.

Next, referring to FIG. 1B, FIG. 1B is a schematic diagram of another one conventional phase controller used in a communication apparatus. The difference between the communication apparatuses 1' and 1 is that the configuration of the phase shifters PD_1 through PD_n of the communication apparatus 1' is not the same as that of the phase shifters PS_1 through PS_n of the communication apparatus 1. Specifically, the communication apparatus 1' adopts the step phase shift configuration of the phase shifters PD_1 through PD_n, each of the phase shifters PD_2 through PD_n receives the transmitted signal being shifted with the phase $\Delta\phi$ by the previous one phase shifters PD_1 through PD (n-1), and the phase shifter receives the transmitted signal. By controlling the phase $\Delta\phi$, the radiation field pattern of the antenna array can be determined.

The shifted phases of the phase shifters in different frequencies are not identical to each other, and the phase shifters have problems of phase imbalance and gain dismatch. Thus, the transmitted signals which are expected to have fixed differential phases may have phase errors and amplitude errors, and it causes the desired radiation filed pattern of the antenna array is not correct.

As mentioned above, another one conventional controlling manner for the antenna array adopts a plurality of PLLs, wherein each neighbor two of PLLs are coupled, and the control signals can be input into the voltage controlled oscillators (VCOs) of the PLLs to control the phase of the antenna array. However, this conventional controlling manner for the antenna array does not comprise a reference signal source with the high precision and the low phase noise, and it uses the coupled VCOs for injection and locking, thus resulting that the high phase noise may exists in the output signals of the VCOs, and the output frequency is not accurate.

SUMMARY OF THE INVENTION

An objective of the present disclosure is to provide a communication apparatus having a phase controller or executing a phase controlling method for an antenna array with a plurality of antennae, so as to have the low phase and amplitude error, the high frequency precision and the correct desired radiation field pattern.

To achieve at least the above objective, the present disclosure provides a phase controller for an antenna array, comprising: a determination circuit, determining a direction index of the antenna array, and calculating a phase index according to the direction index according to a congruence modulo equation; a switching box, connected to the determination circuit, selecting L first frequency signals with L different first phases among K first frequency signals with K different first phases according to the phase index, wherein L and K are integer larger than 1, and L is not larger than K; and a frequency synthesizing module, connected to the switching box, comprising L phase-coherent PLL frequency synthesizers for receiving the L first frequency signals with the L different first phases to generate L second frequency signals with L different second phases to L antennae of the antenna array, wherein a second frequency of the second frequency signals is larger than a first frequency of the first frequency signals; wherein the switching box comprises: a plurality output lines IN_0, IN_1, . . . , IN_K-1; a plurality of input lines OUT_0, OUT_1, . . . , OUT_K-1; and a plurality of switches $r_0, r_1, r_2, \ldots, r_{LK-1}$, first ends of the switches $r_{nK}$ through $r_{(n+1)K-1}$ are connected to the output line OUT_n, and second ends of the switches $r_{nK}$ through $r_{(n+1)K-1}$ are connected to the input lines IN_0 through IN_K-1, wherein n is an integer from 0 through L-1; wherein the switches $r_0, r_1, r_2, \ldots, r_{LK-1}$ are turned on or off according to the phase index, so as to select the L first frequency signals with the L different first phases among the K first frequency signals with the K different first phases; wherein the phase-coherent PLL frequency synthesizer comprises: a mixer, receiving a corresponding one of the L first frequency signals with the L different first phases and a frequency divided signal; a low pass filter, connected to the mixer, filtering an output signal of the mixer; a voltage controlled oscillator, connected to the low pass filter, generating a corresponding one of the L second frequency signals with the L different second phases according to a control voltage output from the low pass filter; and a frequency divider, connected to the mixer and the voltage controlled oscillator, generating the frequency divided signal according to the corresponding second frequency signal with the second phase.

To achieve at least the above objective, the present disclosure provides communication apparatus, comprising: a multi-phase signal generating circuit, providing K first frequency signals with K different first phases; L antennae, forming an antenna array; and the above phase controller for the antenna array, connected between the multi-phase signal generating circuit and the L antennae.

To achieve at least the above objective, the present disclosure provides phase controlling method for an antenna array, comprising: determining a direction index of the antenna array; calculating a phase index according to the direction index according to a congruence modulo equation; selecting L first frequency signals with L different first phases among K first frequency signals with K different first phases according to the phase index, wherein L and K are integer larger than 1, and L is not larger than K; and generating L second frequency signals with L different second phases to L of antennae of the antenna array according to the L first frequency signals with the L different first phases by using L phase-coherent PLL frequency synthesizers, wherein a second frequency of the second frequency signals is larger than a first frequency of the first frequency signals.

In an embodiment of the present disclosure, wherein the K different first phases are 0, $\delta\phi$, $2\delta\phi$, . . . , $(K-1)\delta\phi$, the L different first phases are 0, $\Delta\theta$, $2\Delta\theta$, . . . , $(L-1)\Delta\theta$, the second different phases are 0, $\Delta\phi$, $2\Delta\phi$, . . . , $(L-1)\Delta\phi$, $\delta\phi$ is a phase resolution and equals to $2\pi/K$, $\Delta\phi$ equals to $k\delta\phi$, k is the direction index being an integer, $\Delta\theta$ equals to $l\delta\phi$, l is the phase index being an integer, and the congruence equation is $Ml \equiv k \pmod{K}$ if M and K are mutually prime integers, wherein M is a frequency divisor.

In an embodiment of the present disclosure, wherein the K different first phases are 0, $\delta\phi$, $2\delta\phi$, . . . , $(K-1)\delta\phi$, the L different first phases are 0, $\Delta\theta$, $2\Delta\theta$, . . . , $(L-1)\Delta\theta$, the second different phases are 0, $\Delta\phi$, $2\Delta\phi$, . . . , $(L-1)\Delta\phi$, $\delta\phi$ is a phase resolution and equals to $2\pi/K$, $\Delta\phi$ equals to $k\delta\phi$, k is the direction index being an integer, $\Delta\theta$ equals to $l\delta\phi$, l is the phase index being an integer, and the congruence equation is $Pl \equiv Qk \pmod{QK}$ if $M=P/Q$, and P and Q are mutually prime integers, wherein M is a frequency divisor.

In an embodiment of the present disclosure, the multi-phase signal generating circuit comprises: a voltage controlled delay line, having a plurality of delay units connected in series, receiving a reference clock signal; a phase detector, connected to the voltage controlled delay line, comparing phases of the reference signal and an output signal of the voltage controlled delay line to output a comparison signal; and a low pass filter, connected to the phase detector and the voltage controlled delay line, filtering the comparison signal; wherein a delay time of the delay units is controlled by an output signal of the low pass filter, and input ends of the delay units are used to output the K first frequency signals with the K different first phases.

In an embodiment of the present disclosure, the multi-phase signal generating circuit comprises: a phase-frequency detector, receiving a reference clock signal and a frequency divided signal, and comparing frequencies and phases of the reference clock signal and the frequency divided signal to output a comparison signal; a charge pump, connected to the phase-frequency detector, raising a voltage of the comparison signal; a loop filter, connected to the charge pump, filtering an output signal of the charge pump; a quadrature voltage controlled oscillator, connected to the loop filter, receiving an output signal of the loop filter to generate oscillating signal with quadrature phases; a frequency divider, connected to the quadrature voltage controlled oscillator, receiving one of the oscillating signal with the quadrature phases to generate the frequency divided signal; and an injection-locked frequency divider, connected to the quadrature voltage controlled oscillator, receiving the oscillating signals with the quadrature phases to generate the K first frequency signals with the K different first phases.

In an embodiment of the present disclosure, the communication apparatus further comprises: a L-path front-end circuit module, comprising L front-end circuits, wherein the front-end circuit comprises: a mixer, mixing a transmitted intermediate frequency signal with a corresponding one of the L second frequency signals with the L different second phases; a filter, connected to the mixer, filtering an output signal of the mixer; and a power amplifier, connected to the filter, amplifying an output signal of the filter, so as to generate an output signal to the corresponding antenna.

In an embodiment of the present disclosure, the communication apparatus is a receiver, a transmitter or a transceiver.

In an embodiment of the present disclosure, the direction index is related to a phase, a main radiating direction and a radiation field pattern of the antenna array.

To sum up, compared with the conventional phase controller or phase controlling method for the antenna array, the present disclosure has benefits of the low phase and amplitude error, the high frequency precision and the correct desired radiation field pattern.

DETAILED DESCRIPTION OF THE PREFERRED EMBODIMENTS

To make it easier for the examiner to understand the objects, characteristics and effects of this present disclosure, embodiments together with the attached drawings for the detailed description of the present disclosure are provided.

An embodiment of the present disclosure provides a phase controller for an antenna array in a communication apparatus. Specifically, a direction index of the antenna array (p.s. the direction index is related to a radiation field pattern, a main radiating direction or a phase of the antenna array) is determined according to an actual demand, and then the direction index can be used to calculate a phase index based upon a congruence modulo equation. Based upon the calculated phase index, L first frequency signals with L different first phases are selected from K first frequency signals with K different first phases (p.s. K and L are integers larger than 1, and L is not larger than K), and then the L first frequency signals with the selected L different first phases are input to L phase-coherent PLL frequency synthesizers to generate L second frequency signals with L different second phases respectively, wherein the second frequency signals have a second frequency larger than a frequency of the first frequency signals. Next, the L second frequency signals with the L different second phases are transmitted to L front-end circuits connected to L antennae to control the main radiating direction of the antenna array formed by the L antennae. In addition, a phase controlling method for an antenna array deduced from the concept of the above phase controller for the antenna array is also disclosed.

Figure 1A:
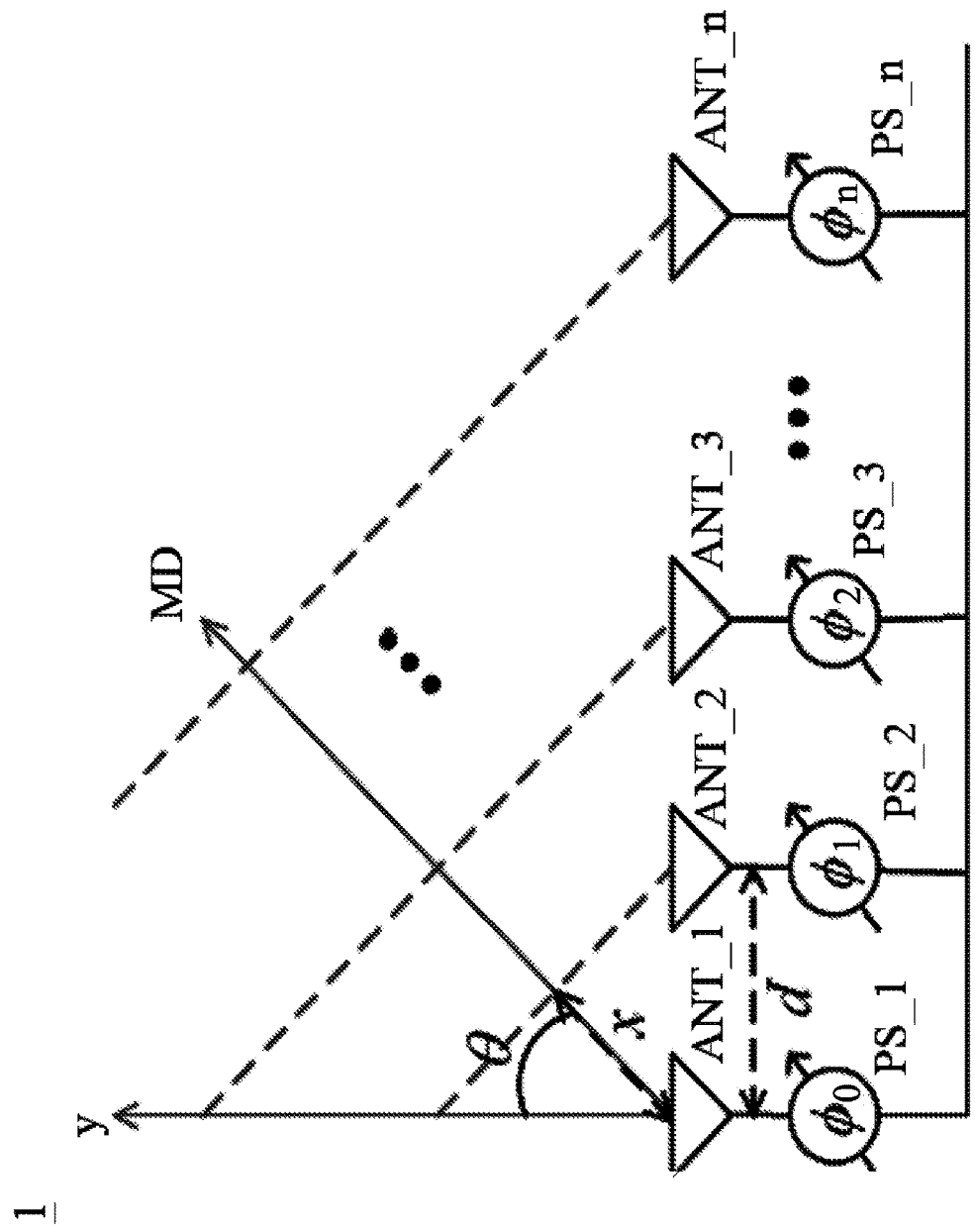
FIG. 1A is a schematic diagram of a conventional phase controller used in a communication apparatus.
Figure 1B:
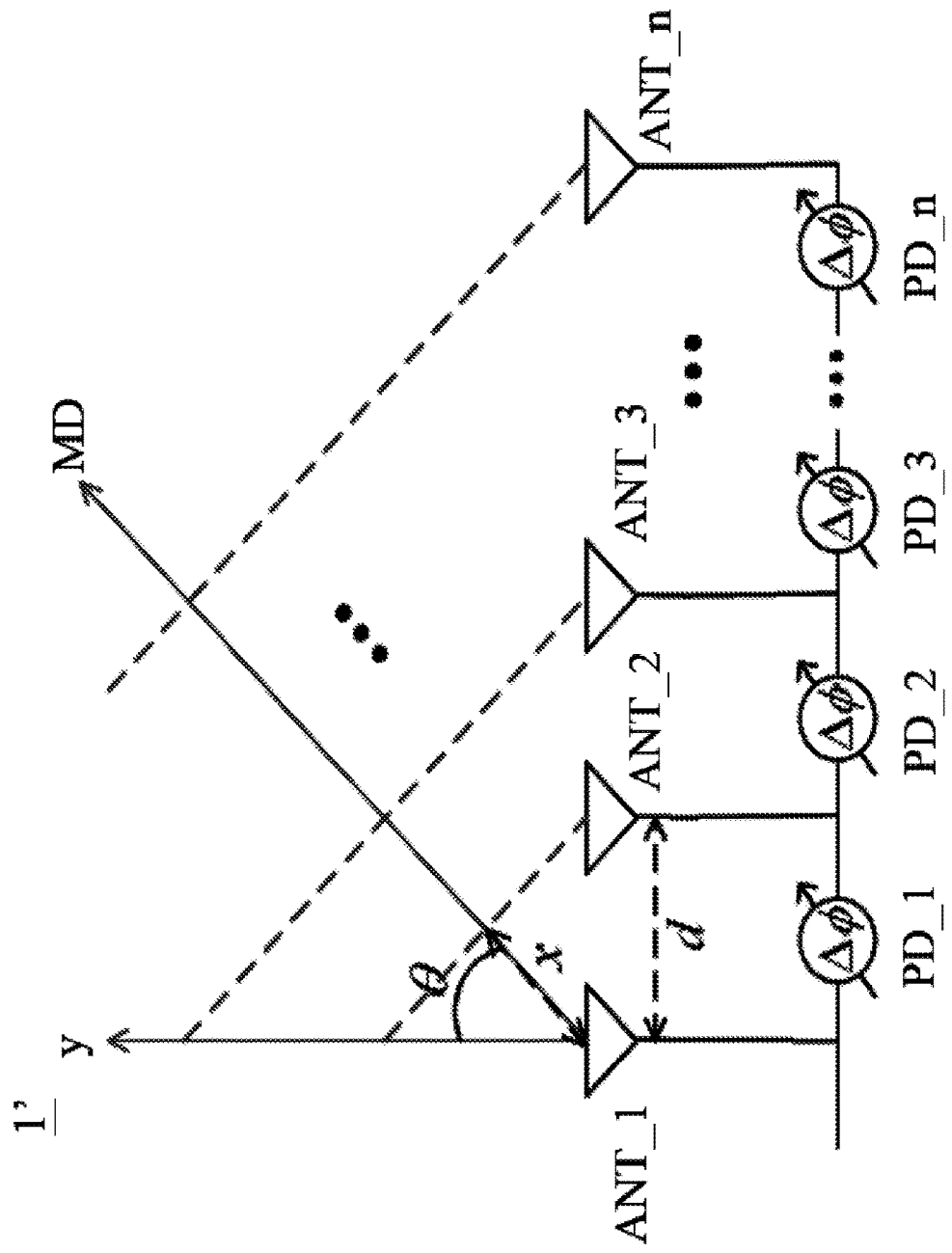
FIG. 1B is a schematic diagram of another one conventional phase controller used in a communication apparatus.
Figure 2:
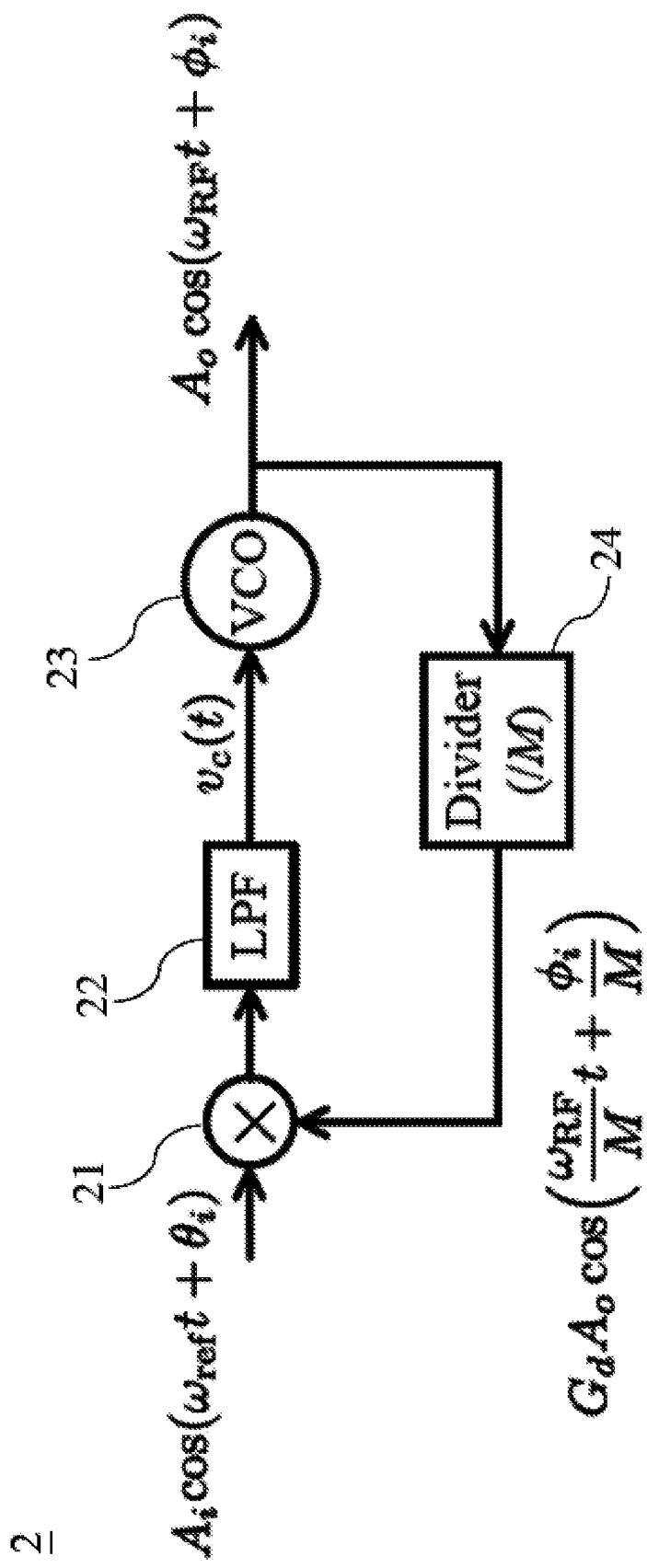
FIG. 2 is a block diagram of a phase-coherent PLL frequency synthesizer according to an embodiment of the present disclosure.

Referring to FIG. 2, FIG. 2 is a block diagram of a phase-coherent PLL frequency synthesizer according to an embodiment of the present disclosure. The phase-coherent PLL frequency synthesizer 2 comprises a mixer 21, a low pass filter (LPF) 22, a VCO 23 and a frequency divider 24, wherein the mixer 21 is connected to the LPF 22 and the frequency divider 24, and the VCO 23 is connected to the LPF 22 and the frequency divider 24.

A first frequency signal with a first phase (i.e. $A_i \cos(\omega_{ref}t+\theta_i)$) is mixed with a frequency divided signal (i.e. $G_d A_0 \cos((\omega_{RF}t/M)+(\phi_i/M))$) by the mixer 21, and the mixer 21 can be the multiplier as known by the person with ordinary skill in the art. The LPF 22 is used to filter the output signal of the mixer 21 to generate a control voltage $v_c(t)$ to the VCO 23. The VCO 23 generate a second frequency signal with a second phase (i.e. $A_o \cos(\omega_{RF}t+\phi_i)$). The second frequency signal with the second phase is input to the frequency divider 24 to generate frequency divided signal.

All above variables are illustrated as follows, $A_i$ is an amplitude of the first frequency signal, $\omega_{ref}$ is a first frequency of the first frequency signal, t is time, $\theta_i$ is the first phase of the first frequency signal, $\omega_{RF}$ is a second frequency of the second frequency signal, $\phi_i$ is a second phase of the second frequency signal, $A_o$ is an amplitude of the second frequency signal, and M is a frequency divisor of the frequency divider 24.

It is noted that, $\cos(\omega_{RF}t+\phi_i)$ can be identical to $\cos(\omega_{RF}t+\phi_i+2\pi m)$, wherein m is an integer. When the first frequency $\omega_{ref}$ equals to $\omega_{RF}/M$ (i.e. $\omega_{ref}=\omega_{RF}/M$) and $M\theta_i$ equals to $\phi_i+2\pi m$ (i.e. $M\theta_i=\phi_i+2\pi m$), the phase locking can be performed. The phase locking condition can be expressed by a congruence modulo equation $M\theta_i \equiv \phi_i \pmod{2\pi}$, wherein the above congruence modulo equation means the remainders of $M\theta_i$ and $\phi_i$ divided by $2\pi$ are the same one.

Figure 3:
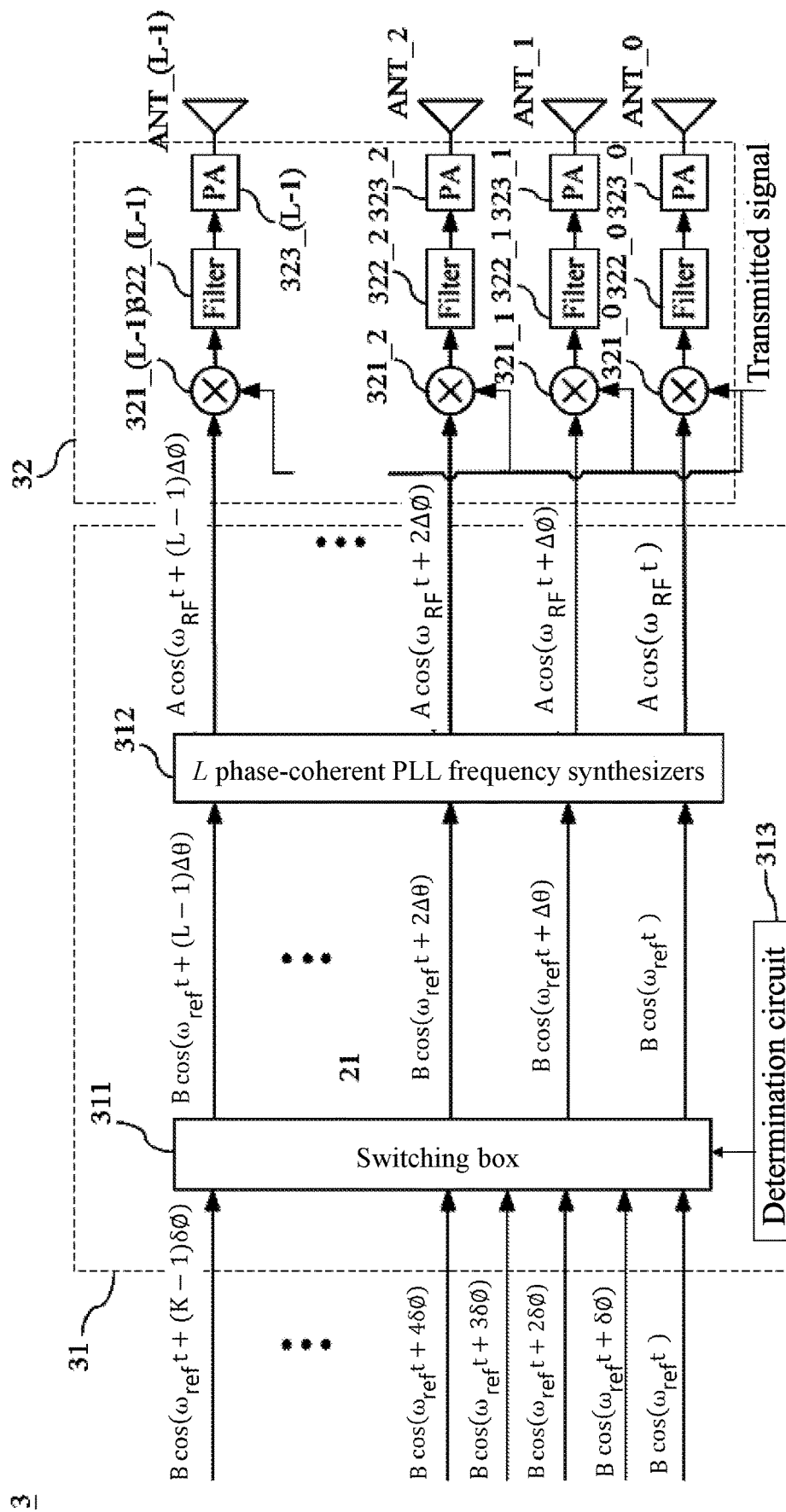
FIG. 3 is a block diagram of a communication apparatus according to an embodiment of the present disclosure.

Next, referring to FIG. 3, FIG. 3 is a block diagram of a communication apparatus according to an embodiment of the present disclosure. The communication apparatus 3 comprises a multi-phase signal generating circuit (not shown in FIG. 3, but shown in FIG. 5 or FIG. 6), a phase controller 31 for an antenna array, the antenna array formed by the antennae ANT_0 through ANT (L−1) and L-path front-end circuit module 32. The phase controller 31 is connected to antenna array via the L-path front-end circuit module 32. The phase controller 31 is used to control the phase of the antenna array, such that the antenna array can have a desired radiation field pattern (i.e. a desired main radiating direction or a desired phase).

The phase controller 31 can receive K first frequency signals with K different first phases (i.e. $B\cos(\omega_{ref}t)$, $B\cos(\omega_{ref}t+\delta\phi)$, $B\cos(\omega_{ref}t+2\delta\phi)$, ..., $B\cos(\omega_{ref}t+(K-1)\delta\phi)$) generated from the multi-phase signal generating circuit (shown in FIG. 5 or FIG. 6) and use portions of them to generate L second frequency signals with L different second phases (i.e. $A\cos(\omega_{RF}t)$, $A\cos(\omega_{RF}t+\Delta\phi)$, $A\cos(\omega_{RF}t+2\delta\phi)$, ..., $A\cos(\omega_{RF}t+(L-1)\Delta\phi)$) to the L-path front-end circuit module 32, so as to control the phase of the antenna array, wherein A and B are amplitudes of the second and first frequency signals, $\delta\phi$ is a phase resolution.

Specifically, the phase controller 31 comprises a switching box 311, a frequency synthesizing module 312 and a determination circuit 313, wherein the frequency synthesizing module 312 has L phase-coherent PLL frequency synthesizers. The L-path front-end circuit module has L front-end circuits, the nth one of the front-end circuits is formed by a mixer 321_n, a filter 322_n, and a power amplifier (PA) 323_n, wherein, n is an integer from 0 through L−1. The mixer 321_n is connected to the filter 322_n, the filter 322_n is connected to the PA 323_n, and the PA 323_n is connected to the antenna ANT_n.

The determination circuit 313 determines a direction index k and accordingly calculates a phase index l according to the direction index k based upon of a congruence modulo equation. The determination circuit 313 further generates controls signals to the switching box 311. The switching box 311 selects L first frequency signals with L different first phases (i.e. $B\cos(\omega_{ref}t)$, $B\cos(\omega_{ref}t+\Delta\theta)$, $B\cos(\omega_{ref}t+2\Delta\theta)$, ..., $B\cos(\omega_{ref}t+(L-1)\Delta\theta)$) among the K frequency signals with the K different first phase according to the control signals (i.e. the control signals are related to the phase index l). The first frequency signals with the L different first phases are respectively input to the L phase-coherent PLL frequency synthesizers of the frequency synthesizing module 312, so as to generate the L second frequency signals with the L different second phases.

Next, the nth one of second frequency signals (i.e. $A\cos(\omega_{RF}t+n\Delta\phi)$) is mixed with the transmitted intermediate frequency (IF) signal by the mixer 321_n. The output signal of the mixer 321_n is filtered and amplified by the filter 322_n and the PA 323_n. Finally, the output signal is of the PA 323_n is transmitted to the antenna ANT_n. It is noted that, if the IF shifting is not required, the L-path front-end circuit module 32 can be removed.

In the embodiment, the desired second phase $\phi_i$ is $n\Delta\phi$, and the first phase $\theta_i$ to be found is $n\Delta\theta$, and thus the above congruence modulo equation can be expressed as $M\Delta\theta \equiv \Delta\phi \pmod{2\pi}$. When the phase resolution $\delta\phi$ is designed to be divisible for $2\pi$ (i.e. $\delta\phi=2\pi/K$), the desired phase $\Delta\phi$ of can be $k\delta\phi$ (i.e. $\Delta\phi=k\delta\phi$, and k is the direction index being an integer), the phase $\Delta\theta$ to be solved is (i.e. i.e. $\Delta\theta=l\delta\phi$, and l is the phase index being an integer), and the above congruence equation can be expressed as $Ml \equiv k \pmod{K}$, wherein M and K are mutually prime integers. That is, when the direction index k is determined by the desired phase $\Delta\phi$, the phase index l can be obtained from the congruence equation $Ml \equiv k \pmod{K}$ if M and K are mutually prime integers.

It is noted that, if M is not an integer (i.e. the phase-coherent PLL frequency synthesizer is a fractional-N phase-coherent PLL frequency synthesizer), the above congruence equation can be expressed as Pl≡Qk(mod QK), wherein M equals to P/Q (i.e. M=P/Q), and P and Q are mutually prime integers. That is, when the direction index k is determined by the desired phase Δϕ, the phase index l can be obtained from the congruence equation Pl≡Qk(mod QK) if M=P/Q, and P and Q are mutually prime integers.

Since the phase index l is solved and Δθ=lδϕ, the phase Δθ is solved. While the phase index l is solved, the L first frequency signals with the L different first phases (i.e. B cos(ωreft), B cos(ωreft+Δθ), B cos(ωreft+2Δθ), . . . , B cos(ωreft+(L−1)Δθ)) can be determined, the switching box 311 can select the L first frequency signals with the L different first phases among the K frequency signals with the K different first phases (i.e. B cos(ωreft), B cos(ωreft+δϕ), B cos(ωreft+2δϕ), . . . , B cos(ωreft+(K−1)δϕ)).

Figure 4:
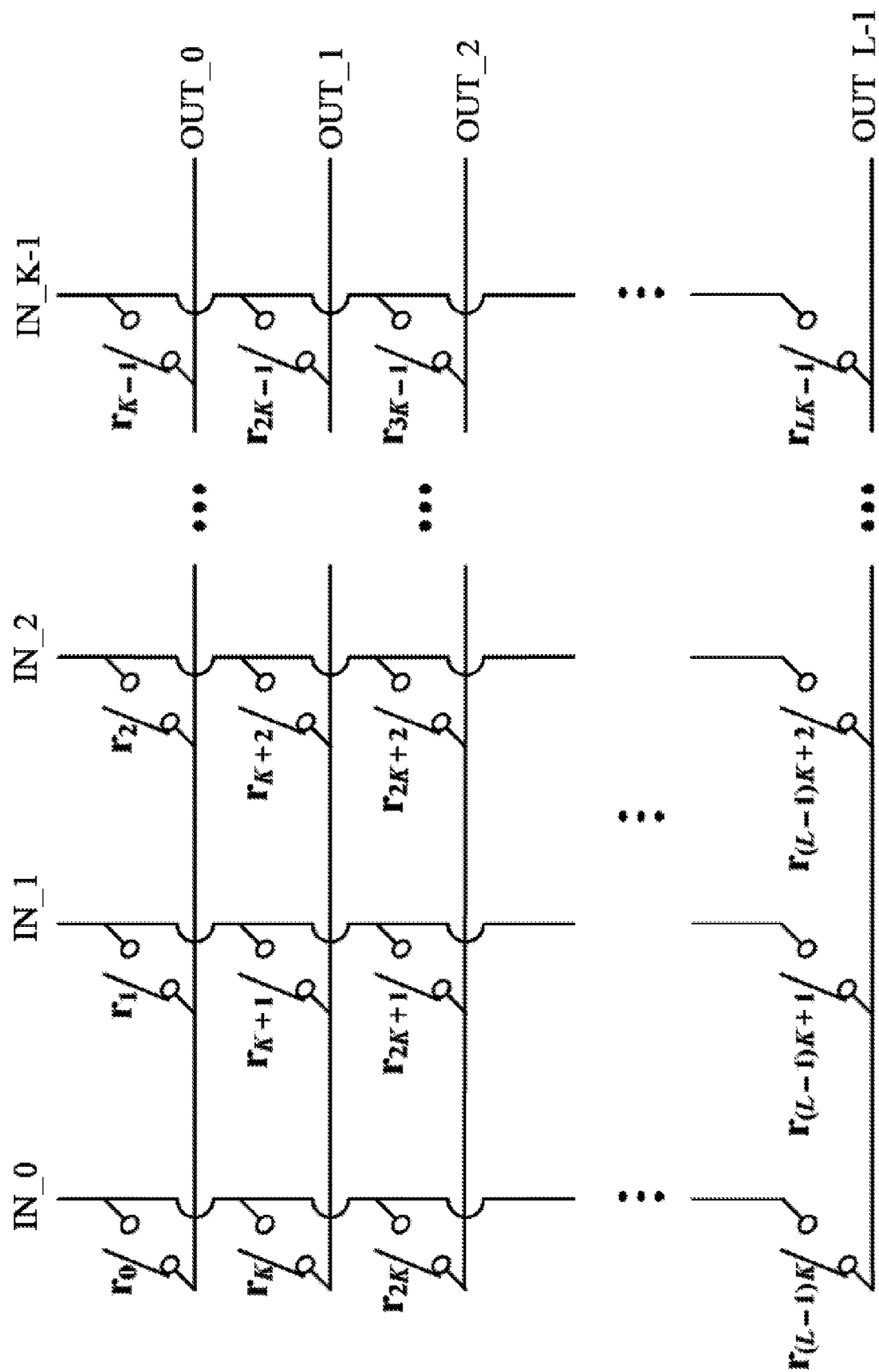
FIG. 4 is a circuit diagram of a switching box according to an embodiment of the present disclosure.

One implementation of the switching box 311 is shown in FIG. 4, and the present disclosure is not limited thereto. Referring to FIG. 4, FIG. 4 is a circuit diagram of a switching box according to an embodiment of the present disclosure. The switching box 4 is a read-only memory (ROM), and comprises a plurality of switches r0 through rLK−1, a plurality of input lines IN_0 through IN_K−1 and a plurality of output lines OUT_0 through OUT_L−1. First ends of the switches rnK through r(n+1)K−1 are connected to the output line OUT_n, and second ends of the switches $r_{nK}$ through r(n+1)K−1 are connected to the input lines IN_0 through IN_K−1. The control signals are used to control the switches r0 through rLK−1 to be turned on or off, such that the input lines IN_1 through IN_K−1 receive the K first frequency signals with the K different first frequencies, and the output lines OUT_1 through OUT_L−1 outputs the selected L first frequency signals with the selected L different first frequencies.

Figure 5:
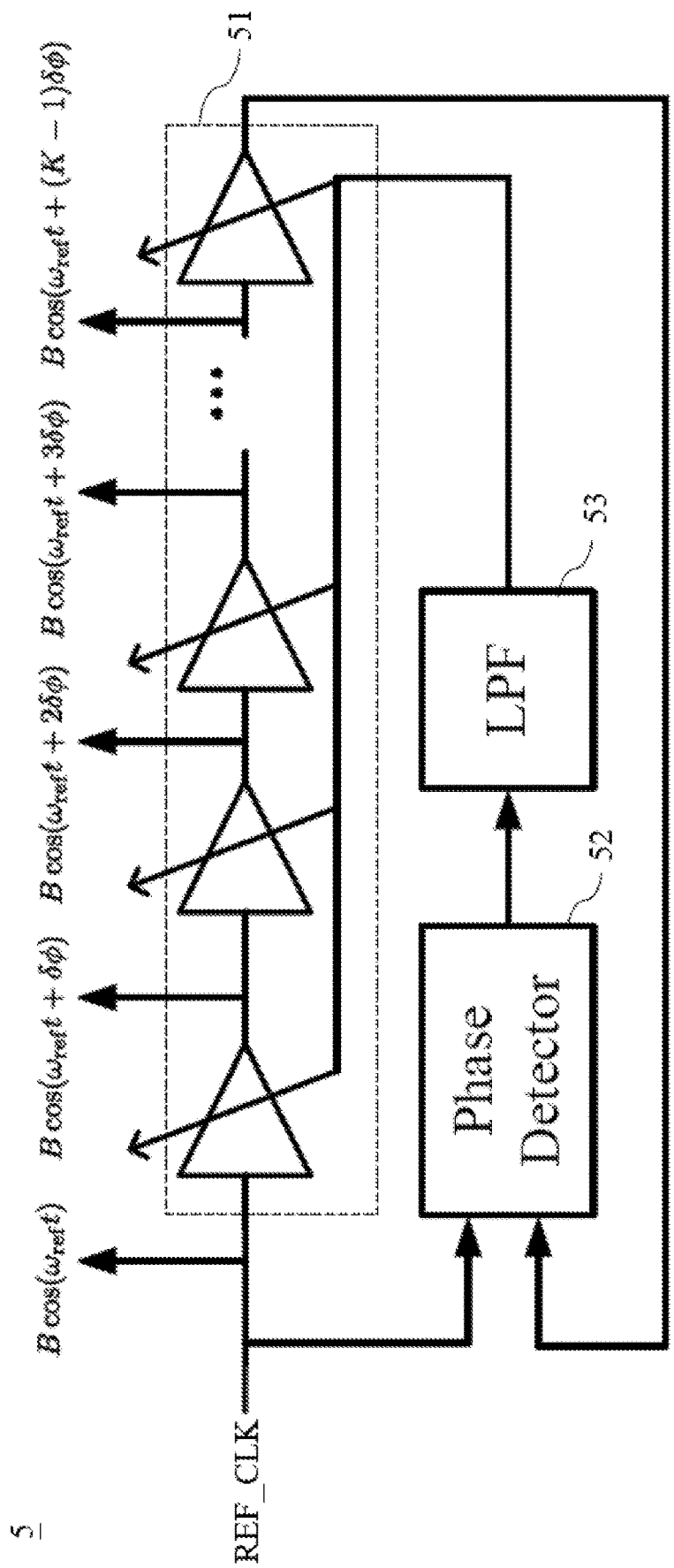
FIG. 5 is a block diagram of a multi-phase signal generating circuit according to an embodiment of the present disclosure.

Next, referring to FIG. 5, FIG. 5 is a block diagram of a multi-phase signal generating circuit according to an embodiment of the present disclosure. The multi-phase signal generating circuit 5 comprises a voltage controlled delay line 51, a phase detector 52 and a LPF 53, wherein the voltage controlled delay line 51 is connected to the LPF 53 and the phase detector 52, and the phase detector 52 is connected to the LPF 53.

The voltage controlled delay line 51 has a plurality of delay units connected in series, and the delay time of the delay units is controlled by the output signal of the LPF 53. A reference clock signal REF_CLK is input to the voltage controlled delay line 51 and the phase detector 52, and the phase detector 52 compares the phases of the reference clock signal REF_CLK and the output signal of the last delay unit of the voltage controlled delay line 51, so as to output a comparison signal. The LPF 53 filters out the high frequency part of the comparison signal. The input ends of the delay units are used to output the K first frequency signals with the K different first phases (i.e. B cos(ωreft), B cos(ωreft+δϕ), B cos(ωreft+2δϕ), . . . , B cos(ωreft+(K−1)δϕ)).

Figure 6:
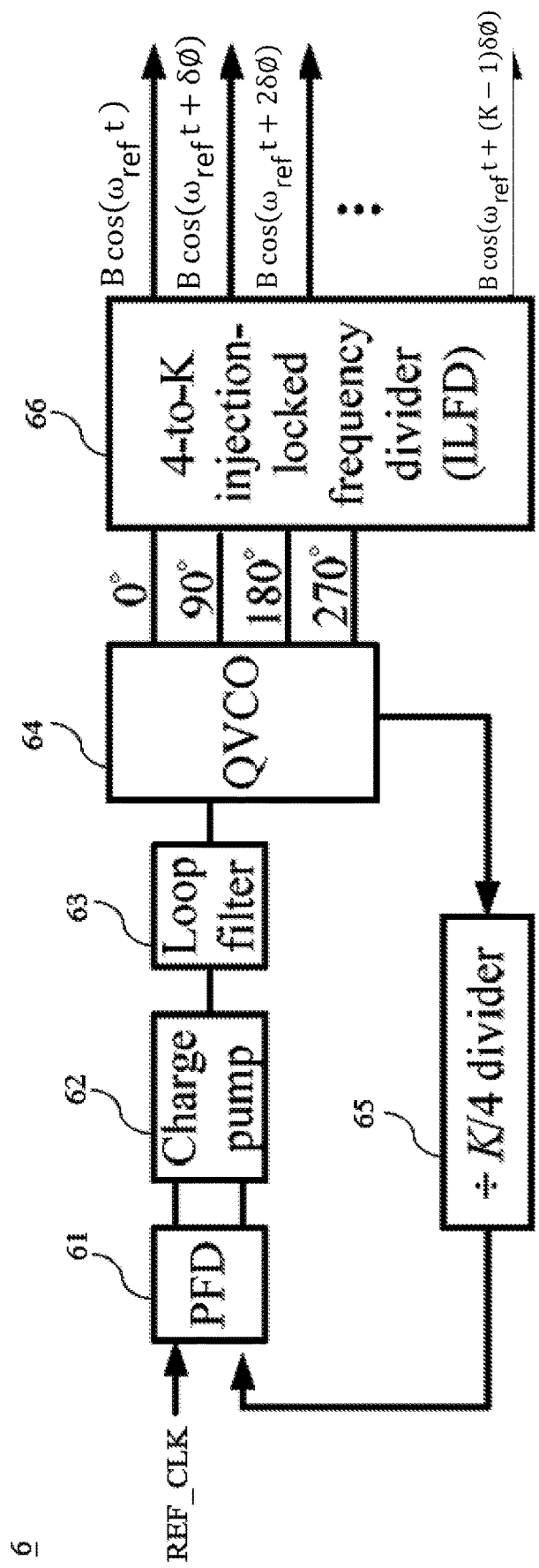
FIG. 6 is a block diagram of a multi-phase signal generating circuit according to another one embodiment of the present disclosure.

It is noted that the implementation of multi-phase signal generating circuit 5 is not used to limit the present disclosure. Next, refereeing to FIG. 6, FIG. 6 is a block diagram of a multi-phase signal generating circuit according to another one embodiment of the present disclosure. The multi-phase signal generating circuit 6 comprises a phase-frequency detector (PFD), a charge pump 62, a loop filter 63, a quadrature VCO (QVCO) 64, a frequency divider 65 and an injection-lock-frequency divider (ILFD) 66. The PFD 61 is connected to the frequency divider 65, the charge pump 62 is connected to the loop filter 63, the loop filter 63 is connected to the QVCO 64, the QVCO 64 is connected to the ILFD 66 and the frequency divider 65.

The PFD 61 receives a reference clock signal REF_CLK and a frequency divided signal from the frequency divider 65 with a divisor of K/4. The PFD 61 compares frequencies and phases of the reference clock signal REF_CLK and the frequency divided signal to output a comparison signal to the charge pump 62. The charge pump 62 raises the voltage of the comparison signal. The loop filter 63 filters the output signal of the charge pump 62, and the QVCO 64 receives the output signal of the loop filter 63 to output oscillating signals with quadrature phases. The frequency divider 65 receives one of the oscillating signals with quadrature phases, and divides the frequency of the received oscillating signal. The ILFD 66 is a 4-to-K ILFD, and receives the oscillating signals with the quadrature phases to generate the K first frequency signals with the K different first phases (i.e. B cos(ωreft), B cos(ωreft+δϕ), B cos(ωreft+2δϕ), . . . , B cos(ωreft+(K−1)δϕ)).

Figure 7:
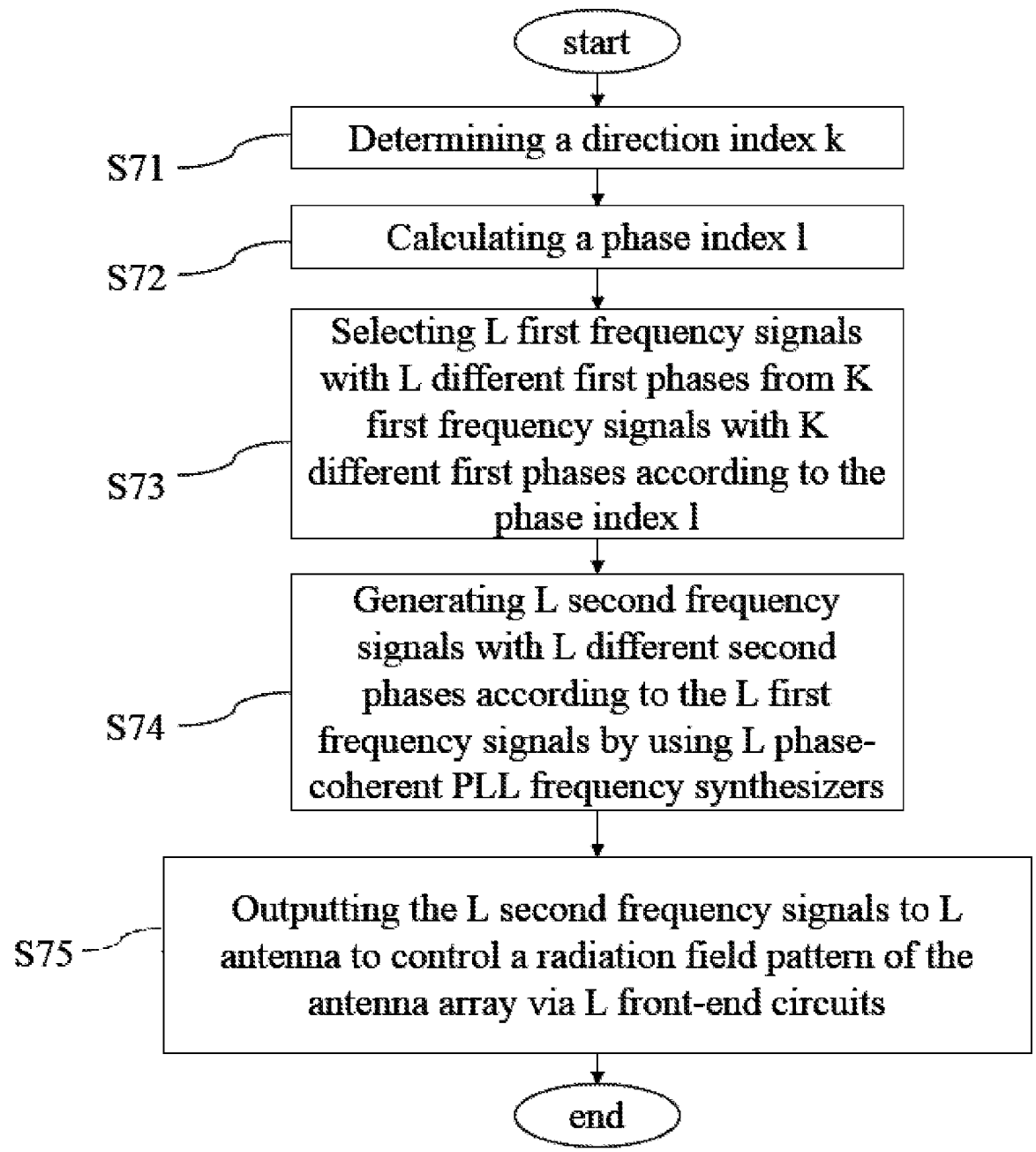
FIG. 7 is a flow chart of a phase controlling method for an antenna array according to an embodiment of the present disclosure.

FIG. 7 is a flow chart of a phase controlling method for an antenna array according to an embodiment of the present disclosure. The phase controlling method is executed in a communication apparatus which has a plurality of antennae forming an antenna array, wherein the communication apparatus can be the receiver, the transmitter or the transceiver. At step S71, a direction index k is determined according to the phase of the antenna array. Then at step S72, a phase index l is calculated according the direction index k based upon the above congruence modulo equation.

At step S73, L first frequency signals with L different first phases are selected from K first frequency signals with K different first phases according to the phase index l. Then, at step S74, L second frequency signals with L different second phases are generated according to the L first frequency signals with the selected L different first phases by using L phase-coherent PLL frequency synthesizers. Next, at step S75, the L second frequency signals with the selected L different second phases are output to L antenna to control a radiation field pattern of the antenna array via L front-end circuits.

Figure 8A:
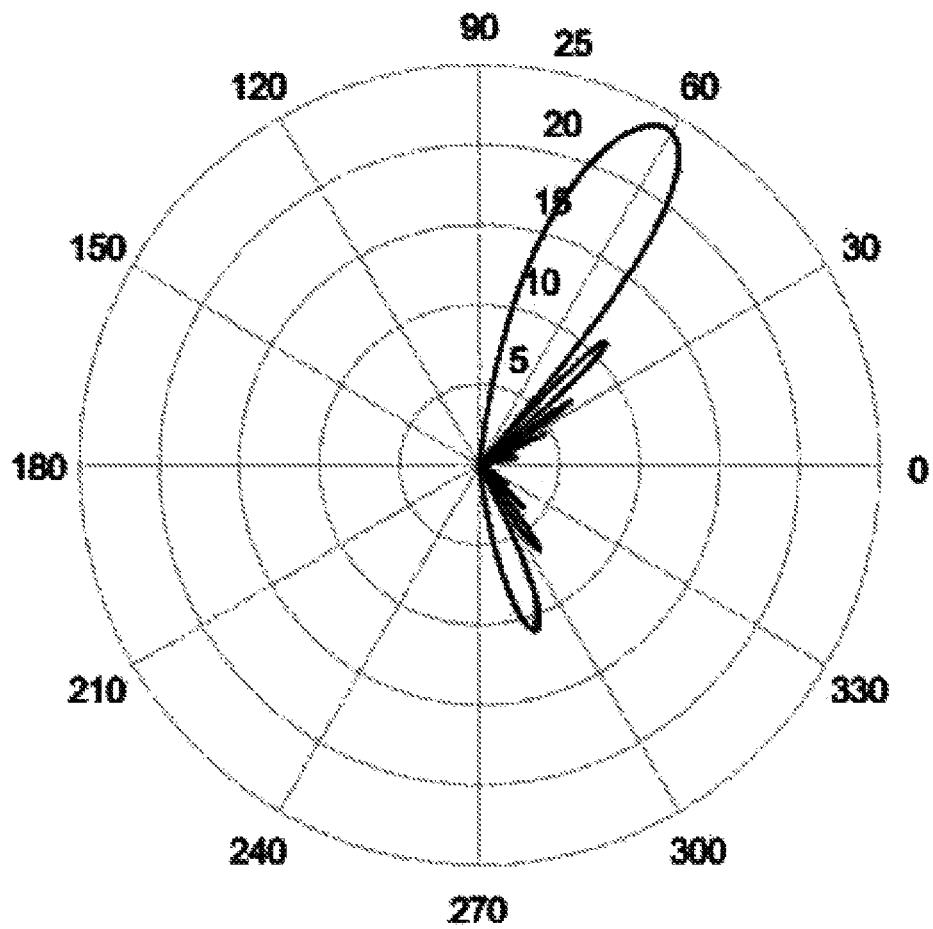
FIG. 8A is a schematic diagram of radiation field patterns of antenna array with different direction indices while the phase controller or phase controlling method for the antenna array according to an embodiment of the present disclosure is used.
Figure 8B:
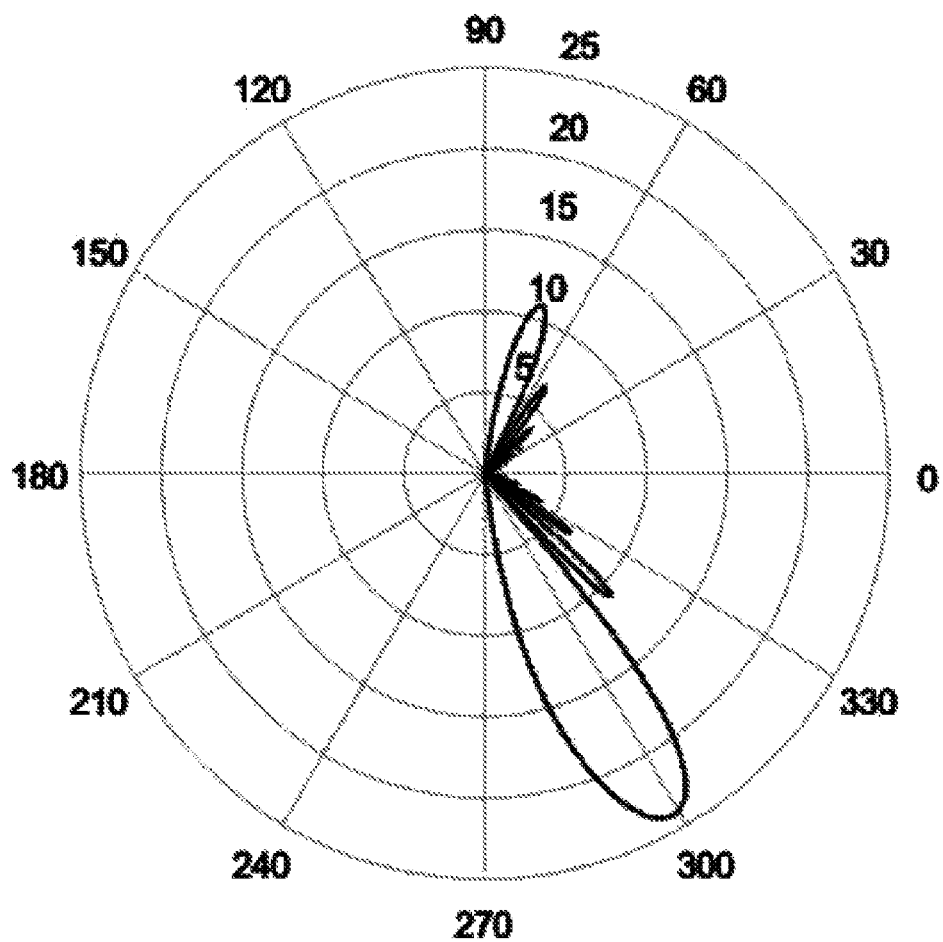
FIG. 8B is a schematic diagram of radiation field patterns of antenna array with different direction indices while the phase controller or phase controlling method for the antenna array according to an embodiment of the present disclosure is used.

Next, referring FIG. 8A and FIG. 8B, FIG. 8A and FIG. 8B are schematic diagrams of radiation field patterns of antenna array with different direction indices while the phase controller or phase controlling method for the antenna array according to an embodiment of the present disclosure is used. In this embodiment, the conditions are given as follows: M=181, K=64, L=16, k=14 for FIG. 8A, and k=−14 (or 50) for FIG. 8B.

In FIG. 8A, since the direction index k is 14, the solved phase index l based upon the congruence equation Ml≡k (mod K) is 22, and thus the selected 16 first phases ϕin of the 16 first frequency signals and the second phases ϕout of the 16 second frequency signals is shown in Table 1 (p.s. the above phase are presented by the remainders of 2π). The radiation field pattern in FIG. 8A shows the phase of the antenna array is about 60 degrees.

TABLE 1

| $\phi_{out}$ | 0 | 14π/32 | 28π/32 | 42π/32 | 56π/32 | 6π/32 | 20π/32 |
|---|---|---|---|---|---|---|---|
| $\phi_{in}$ | 0 | 22π/32 | 44π/32 | 2π/32 | 24π/32 | 46π/32 | 4π/32 |
| $\phi_{out}$ | 34π/32 | 48π/32 | 62π/32 | 12π/32 | 26π/32 | 40π/32 | 54π/32 |
| $\phi_{in}$ | 26π/32 | 48π/32 | 6π/32 | 28π/32 | 50π/32 | 8π/32 | 30π/32 |
| $\phi_{out}$ | 4π/32 | 18π/32 | NA | NA | NA | NA | NA |
| $\phi_{in}$ | 52π/32 | 10π/32 | NA | NA | NA | NA | NA |

In FIG. 8B, since the direction index k is −14, the solved phase index l based upon the congruence equation Ml≡k (mod K) is −22, and thus the selected 16 first phases φin of the 16 first frequency signals and the second phases φout of the 16 second frequency signals is shown in Table 2 (p.s. the above phase are presented by the remainders of 2π). The radiation field pattern in FIG. 8B shows the phase of the antenna array is about 300 degrees.

TABLE 2

| | | | | | | | |
|---|---|---|---|---|---|---|---|
| φ$_{out}$ | 0 | 50π/32 | 36π/32 | 22π/32 | 8π/32 | 58π/32 | 44π/32 |
| φ$_{in}$ | 0 | 42π/32 | 20π/32 | 62π/32 | 40π/32 | 18π/32 | 60π/32 |
| φ$_{out}$ | 30π/32 | 16π/32 | 2π/32 | 52π/32 | 38π/32 | 24π/32 | 10π/32 |
| φ$_{in}$ | 38π/32 | 16π/32 | 58π/32 | 36π/32 | 14π/32 | 56π/32 | 34π/32 |
| φ$_{out}$ | 60π/32 | 46π/32 | NA | NA | NA | NA | NA |
| φ$_{in}$ | 12π/32 | 54π/32 | NA | NA | NA | NA | NA |

In collusion, the present disclosure is used to provide a communication apparatus having a phase controller or executing a phase controlling method for an antenna array with a plurality of antennae, so as to have the low phase and amplitude error, the high frequency precision and the correct desired radiation field pattern.

While the present disclosure has been described by means of specific embodiments, numerous modifications and variations could be made thereto by those skilled in the art without departing from the scope and spirit of the present disclosure set forth in the claims.

What is claimed is:

1. A phase controller for an antenna array, comprising:
   a determination circuit, determining a direction index of the antenna array, and calculating a phase index according to the direction index according to a congruence modulo equation;
   a switching box, connected to the determination circuit, selecting L first frequency signals with L different first phases among K first frequency signals with K different first phases according to the phase index, wherein L and K are integer larger than 1, and L is not larger than K; and
   a frequency synthesizing module, connected to the switching box, comprising L phase-coherent PLL frequency synthesizers for receiving the L first frequency signals with the L different first phases to generate L second frequency signals with L different second phases to L antennae of the antenna array, wherein a second frequency of the second frequency signals is larger than a first frequency of the first frequency signals;
   wherein the switching box comprises:
   a plurality output lines IN_0, IN_1, . . . , IN_K−1;
   a plurality of input lines OUT_0, OUT_1, . . . , OUT_K−1; and
   a plurality of switches $r_0, r_1, r_2, \ldots, r_{LK-1}$, first ends of the switches $r_{nK}$ through $r_{(n+1)K-1}$ are connected to the output line OUT_n, and second ends of the switches $r_{nK}$ through $r_{(n+1)K-1}$ are connected to the input lines IN_0 through IN_K−1, wherein n is an integer from 0 through L−1;
   wherein the switches $r_0, r_1, r_2, \ldots, r_{LK-1}$ are turned on or off according to the phase index, so as to select the L first frequency signals with the L different first phases among the K first frequency signals with the K different first phases;
   wherein the phase-coherent PLL frequency synthesizer comprises:
   a mixer, receiving a corresponding one of the L first frequency signals with the L different first phases and a frequency divided signal;
   a low pass filter, connected to the mixer, filtering an output signal of the mixer;
   a voltage controlled oscillator, connected to the low pass filter, generating a corresponding one of the L second frequency signals with the L different second phases according to a control voltage output from the low pass filter; and
   a frequency divider, connected to the mixer and the voltage controlled oscillator, generating the frequency divided signal according to the corresponding second frequency signal with the second phase.

2. The phase controller for the antenna array according to claim 1, wherein the K different first phases are 0, δφ, 2δφ, . . . , (K−1)δφ, the L different first phases are 0, Δθ, 2Δθ, . . . , (L−1)Δθ, the second different phases are 0, Δφ, 2Δφ, . . . , (L−1)Δφ, δφ is a phase resolution and equals to 2π/K, Δφ equals to kδφ, k is the direction index being an integer, Δθ equals to lδφ, l is the phase index being an integer, and the congruence equation is Ml≡k(mod K) if M and K are mutually prime integers, wherein M is a frequency divisor.

3. The phase controller for the antenna array according to claim 1, wherein the K different first phases are 0, δφ, 2δφ, . . . , (K−1)δφ, the L different first phases are 0, Δθ, 2Δθ, . . . , (L−1)Δθ, the second different phases are 0, Δφ, 2Δφ, . . . , (L−1)Δφ, δφ is a phase resolution and equals to 2π/K, Δφ equals to kδφ, k is the direction index being an integer, Δθ equals to lδφ, l is the phase index being an integer, and the congruence equation is Pl≡Qk(mod QK) if M=P/Q, and P and Q are mutually prime integers, wherein M is a frequency divisor.

4. The phase controller for the antenna array according to claim 1, wherein the direction index is related to a phase, a main radiating direction and a radiation field pattern of the antenna array.

5. A communication apparatus, comprising:
   a multi-phase signal generating circuit, providing K first frequency signals with K different first phases;
   L antennae, forming an antenna array; and
   a phase controller for the antenna array, connected between the multi-phase signal generating circuit and the L antennae, comprising:
   a determination circuit, determining a direction index of the antenna array, and calculating a phase index according to the direction index according to a congruence modulo equation;
   a switching box, connected to the determination circuit, selecting L first frequency signals with L different first phases among the K first frequency signals with the K different first phases according to the phase index, wherein L and K are integer larger than 1, and L is not larger than K; and
   a frequency synthesizing module, connected to the switching box, comprising L phase-coherent PLL frequency synthesizers for receiving the L first frequency signals with the L different first phases to generate L second frequency signals with L different second phases to the L antennae of the antenna array, wherein a second frequency of the second frequency signals is larger than a first frequency of the first frequency signals
   wherein the switching box comprises:
   a plurality output lines IN_0, IN_1, . . . , IN_K−1;
   a plurality of input lines OUT_0, OUT_1, . . . , OUT_K−1; and a plurality of switches $r_0, r_1, r_2, \ldots, r_{LK-1}$, first ends of the switches $r_{nK}$ through $r_{(n+1)K-1}$ are connected to the output line OUT_n, and second ends of the switches $r_{nK}$ through $r_{(n+1)K-1}$ are connected to the input lines IN_0 through IN_K−1, wherein n is an integer from 0 through L−1;

wherein the switches $r_0, r_1, r_2, \ldots, r_{LK-1}$ are turned on or off according to the phase index, so as to select the L first frequency signals with the L different first phases among the K first frequency signals with the K different first phases;

wherein the phase-coherent PLL frequency synthesizer comprises:
a mixer, receiving a corresponding one of the L first frequency signals with the L different first phases and a frequency divided signal;
a low pass filter, connected to the mixer, filtering an output signal of the mixer;
a voltage controlled oscillator, connected to the low pass filter, generating a corresponding one of the L second frequency signals with the L different second phases according to a control voltage output from the low pass filter; and
a frequency divider, connected to the mixer and the voltage controlled oscillator, generating the frequency divided signal according to the corresponding second frequency signal with the second phase.

6. The communication apparatus according to claim 5, wherein the K different first phases are 0, $\delta\phi$, $2\delta\phi$, ..., $(K-1)\delta\phi$, the L different first phases are 0, $\Delta\theta$, $2\Delta\theta$, ..., $(L-1)\Delta\theta$, the second different phases are 0, $\Delta\phi$, $2\Delta\phi$, ..., $(L-1)\Delta\phi$, $\delta\phi$ is a phase resolution and equals to $2\pi/K$, $\Delta\phi$ equals to $k\delta\phi$, k is the direction index being an integer, $\Delta\theta$ equals to $l\delta\phi$, l is the phase index being an integer, and the congruence equation is $Ml \equiv k \pmod{K}$ if M and K are mutually prime integers, wherein M is a frequency divisor.

7. The communication apparatus according to claim 5, wherein the K different first phases are 0, $\delta\phi$, $2\delta\phi$, ..., $(K-1)\delta\phi$, the L different first phases are 0, $\Delta\theta$, $2\Delta\theta$, ..., $(L-1)\Delta\theta$, the second different phases are 0, $\Delta\phi$, $2\Delta\phi$, ..., $(L-1)\Delta\phi$, $\delta\phi$ is a phase resolution and equals to $2\pi/K$, $\Delta\phi$ equals to $k\delta\phi$, k is the direction index being an integer, $\Delta\theta$ equals to $l\delta\phi$, l is the phase index being an integer, and the congruence equation is $Pl \equiv Qk \pmod{QK}$ if M=P/Q, and P and Q are mutually prime integers, wherein M is a frequency divisor.

8. The communication apparatus according to claim 5, wherein the multi-phase signal generating circuit comprises:
a voltage controlled delay line, having a plurality of delay units connected in series, receiving a reference clock signal;
a phase detector, connected to the voltage controlled delay line, comparing phases of the reference signal and an output signal of the voltage controlled delay line to output a comparison signal; and
a low pass filter, connected to the phase detector and the voltage controlled delay line, filtering the comparison signal;
wherein a delay time of the delay units is controlled by an output signal of the low pass filter, and input ends of the delay units are used to output the K first frequency signals with the K different first phases.

9. The communication apparatus according to claim 5, wherein the multi-phase signal generating circuit comprises:
a phase-frequency detector, receiving a reference clock signal and a frequency divided signal, and comparing frequencies and phases of the reference clock signal and the frequency divided signal to output a comparison signal;
a charge pump, connected to the phase-frequency detector, raising a voltage of the comparison signal;
a loop filter, connected to the charge pump, filtering an output signal of the charge pump;
a quadrature voltage controlled oscillator, connected to the loop filter, receiving an output signal of the loop filter to generate oscillating signal with quadrature phases;
a frequency divider, connected to the quadrature voltage controlled oscillator, receiving one of the oscillating signal with the quadrature phases to generate the frequency divided signal; and
an injection-locked frequency divider, connected to the quadrature voltage controlled oscillator, receiving the oscillating signals with the quadrature phases to generate the K first frequency signals with the K different first phases.

10. The communication apparatus according to claim 5, further comprising:
a L-path front-end circuit module, comprising L front-end circuits, wherein the front-end circuit comprises:
a mixer, mixing a transmitted intermediate frequency signal with a corresponding one of the L second frequency signals with the L different second phases;
a filter, connected to the mixer, filtering an output signal of the mixer; and
a power amplifier, connected to the filter, amplifying an output signal of the filter, so as to generate an output signal to the corresponding antenna.

11. The communication apparatus according to claim 5, wherein the communication apparatus is a receiver, a transmitter or a transceiver.

12. The communication apparatus according to claim 5, wherein the direction index is related to a phase, a main radiating direction and a radiation field pattern of the antenna array.

13. A phase controlling method for an antenna array, comprising:
determining a direction index of the antenna array;
calculating a phase index according to the direction index according to a congruence modulo equation;
selecting L first frequency signals with L different first phases among K first frequency signals with K different first phases according to the phase index, wherein L and K are integer larger than 1, and L is not larger than K; and
generating L second frequency signals with L different second phases to L of antennae of the antenna array according to the L first frequency signals with the L different first phases by using L phase-coherent PLL frequency synthesizers, wherein a second frequency of the second frequency signals is larger than a first frequency of the first frequency signals;
wherein the K different first phases are 0, $\delta\phi$, $2\delta\phi$, ..., $(K-1)\delta\phi$, the L different first phases are 0, $\Delta\theta$, $2\Delta\theta$, ..., $(L-1)\Delta\theta$, the second different phases are 0, $\Delta\phi$, $2\Delta\phi$, ..., $(L-1)\Delta\phi$, $\delta\phi$ is a phase resolution and equals to $2\pi/K$, $\Delta\phi$ equals to $k\delta\phi$, k is the direction index being an integer, $\Delta\theta$ equals to $l\delta\phi$, and l is the phase index being an integer;
wherein the congruence equation is $Ml \equiv k \pmod{K}$ if M and K are mutually prime integers, wherein M is a frequency divisor; the congruence equation is $Pl \equiv Qk \pmod{QK}$ if $M=P/Q$, and P and Q are mutually prime integers;

wherein the direction index is related to a phase, a main radiating direction and a radiation field pattern of the antenna array.

* * * * *